US008866146B2

(12) United States Patent
Mascarenhas et al.

(10) Patent No.: US 8,866,146 B2
(45) Date of Patent: Oct. 21, 2014

(54) LATTICE-MISMATCHED GAINP LED DEVICES AND METHODS OF FABRICATING SAME

(75) Inventors: Angelo Mascarenhas, Golden, CO (US); Myles A. Steiner, Golden, CO (US); Lekhnath Bhusal, Golden, CO (US); Yong Zhang, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 31 days.

(21) Appl. No.: 13/262,509

(22) PCT Filed: Apr. 15, 2010

(86) PCT No.: PCT/US2010/031279
§ 371 (c)(1),
(2), (4) Date: Sep. 30, 2011

(87) PCT Pub. No.: WO2010/121057
PCT Pub. Date: Oct. 21, 2010

(65) Prior Publication Data
US 2012/0032187 A1  Feb. 9, 2012

Related U.S. Application Data

(60) Provisional application No. 61/169,980, filed on Apr. 16, 2009.

(51) Int. Cl.
*H01L 33/02* (2010.01)
*H01L 33/00* (2010.01)

(52) U.S. Cl.
CPC ................................. *H01L 33/0075* (2013.01)
USPC ........ 257/76; 257/103; 257/98; 257/E33.005; 438/36

(58) Field of Classification Search
USPC ................. 257/76, 103, 98, E33.005; 438/36
See application file for complete search history.

(56) References Cited

U.S. PATENT DOCUMENTS

| 5,455,429 | A | * | 10/1995 | Paoli et al. | 257/20 |
|---|---|---|---|---|---|
| 6,002,142 | A | * | 12/1999 | Paoli | 257/21 |
| 6,566,688 | B1 | * | 5/2003 | Zhang et al. | 257/85 |
| 7,701,991 | B2 | * | 4/2010 | Bean et al. | 372/43.01 |
| 7,807,980 | B2 | * | 10/2010 | Shishido et al. | 250/492.1 |
| 8,063,397 | B2 | | 11/2011 | Mori et al. | |
| 2007/0002915 | A1 | * | 1/2007 | Bean et al. | 372/45.011 |

OTHER PUBLICATIONS

International Search Report for international application (PCT) PCT/US2010/031279, mailed on Jun. 16, 2010, pp. 1-3.

(Continued)

*Primary Examiner* — Zandra Smith
*Assistant Examiner* — Damian A Hillman
(74) *Attorney, Agent, or Firm* — John C. Stolpa; Michael McIntyre

(57) ABSTRACT

A method (100) of fabricating an LED or the active regions of an LED and an LED (200). The method includes growing, depositing or otherwise providing a bottom cladding layer (208) of a selected semiconductor alloy with an adjusted bandgap provided by intentionally disordering the structure of the cladding layer (208). A first active layer (202) may be grown above the bottom cladding layer (208) wherein the first active layer (202) is fabricated of the same semiconductor alloy, with however, a partially ordered structure. The first active layer (202) will also be fabricated to include a selected n or p type doping. The method further includes growing a second active layer (204) above the first active layer (202) where the second active layer (204) Is fabricated from the same semiconductor alloy.

32 Claims, 4 Drawing Sheets

(56) References Cited

OTHER PUBLICATIONS

Written Opinion for International application (PCT) PCT/US2010/031279, mailed on Jun. 16, 2010, pp. 1-7.

International Preliminary Report on Patentability for International application (PCT) PCT/US2010/031279, issued Oct. 18, 2011, pp. 1-9.

Ahrenkiel et al., "Characterization Survey of $Ga_xIn_{1-x}As/InAs_yP_{1-y}$ Double Heterostructures and $InAs_yP_{1-y}$ Multilayers Grown on InP", Journal of Electronic Materials, 2004, vol. 33, No. 3, pp. 185-193.

Barnett et al., "Very High Efficiency Solar Cell Modules", Progress in Photovoltaics: Research and Applications, 2009, vol. 17, pp. 75-83.

Geisz et al., "High-efficiency GaInP/GaAs/InGaAs triple-junction solar cells grown inverted with a metamorphic bottom junction", Applied Physics Letters, 2007, vol. 91, pp. 023502-1-023502-3.

Geisz et al., "40% efficient inverted triple-junction solar cell with two independently metamorphic junctions", Applied Physics Letters, 2008, vol. 93, pp. 123505-1-123505-3.

Kim et al., "Visable Light-emitting Diodes Grown on Optimized $V_x[In_xGa_{1-x}]P/GaP$ Epitaxial Transparent Substrates with Controlled Dislocation Density", Journal of Electronic Materials, 2000, vol. 29, No. 8, pp. L9-L12.

King et al, "40% efficient metamorphic GaInP/GaInAs/Ge multijunction solar cells", Applied Physics Letters, 2007, vol. 90, pp. 183516-1-183516-3.

Kurtz et al., "Effect of growth rate on the band gap of $Ga_{0.5}In_{0.5}P$", Applied Physics Letters, 1990, vol. 57, pp. 1922-1924.

Lee et al., "Disorder/order/disorder $Ga_{0.5}In_{0.5}P$ visable light-emitting diodes", Journal of Applied Physics, Dec. 1, 1992, vol. 72, No. 11, pp. 5420-5422.

Mascarenhas et al., "The Physics of Tunable Disorder in Semiconductor Alloys", from Spontaneous Ordering in Semiconductor Alloys, 2002, Chapter 11, pp. 283-327.

Olson et al., "A 27.3% effcient $Ga_{0.5}In_{0.5}P$/GaAs tandem solar cells", Applied Physics Letters, 1990, vol. 56, pp. 623-625.

Suzuki, "Basic Aspects of Atomic Ordering in III-V Semiconductor Alloys", from Spontaneous Ordering in Semiconductor Alloys, 2002, Chapter 1, pp. 1-42.

Wei, "Effects of Ordering on Physical Properties of Semiconductor Alloys", from Spontaneous Ordering in Semiconductor Alloys, 2002, Chapter 15, pp. 423-450.

Zhang et al., "Interplay of alloying and ordering on the electronic structure of $Ga_xIn_{1-x}P$ alloys", Physical Review B, 2008, vol. 78, pp. 235202-1-235202-8.

Zhang et al., "Non-Bloch Nature of Alloy States in a Conventional Semiconductor Alloy: $Ga_xIn_{1-x}P$ as an Example", Physical Review Letters, Jul. 18, 2008, vol. 101, pp. 036403-1-036403-4.

Zhang et al., "Tailoring the electronic properties of $Ga_xIn_{1-x}P$ beyond simply varying alloy composition", Applied Physics Letters, 2009, vol. 94, pp. 091113-1-091113-3.

* cited by examiner

LATTICE-MISMATCHED GAINP LED DEVICES AND METHODS OF FABRICATING SAME

CROSS-REFERENCE TO RELATED APPLICATIONS

The present application is a national stage entry of International Application No. PCT/US10/31279, filed Apr. 15, 2009 which claims priority from U.S. Provisional Application No. 61/169,980 filed Apr. 16, 2009, the entire disclosures of which are incorporated herein by reference.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

A light emitting diode (LED) is a type of semiconductor lighting device increasingly used for virtually any and all type of lighting applications. LEDs include a p-n junction like other solid state diodes. As current flows from the p side of the junction to the n side of the junction and electrons transition into a lower energy state through recombination with a hole. Upon transition, the electrons release light energy. The wavelength of the light emitted at a given junction, and therefore the color of the light emitted, depends upon the bandgap energy of the materials forming the p-n junction. Accordingly, each p-n junction emits light at one wavelength and most LEDs are monochromatic devices.

A LED "green gap" exists covering a wavelength emission range of about 530 nm to 570 nm. Although green emitting LEDs are know, the fabrication of devices having comparable efficiency to LEDs designed to emit in other portions of the spectrum has posed significant technological challenges for the solid state lighting industry. An underlying problem with efficient LEDs emitting in the green gap is the lack of, or the difficulty encountered in creating, semiconductor materials having a suitable bandgaps for emission in the green gap.

Green emitting LEDs have been fabricated, for example, from GaInN and other wide bandgap nitrides. GaInN devices that have a suitable bandgap for emission in the green gap may suffer from reduced efficiency and stability because of poor material quality. The material quality of GaInN devices can be compromised because of alloy phase separation when substantial amounts of In are added to GaN, or when substantial amounts of Ga are added to InN. In addition, the GaN and other substrates required for GaInN devices having a suitable bandgap for emission in the green gap may be relatively expensive.

Alternatively, green emitting LEDs may be fabricated from AlGaInP or other quaternary semiconductor alloys containing aluminum. Presently, aluminum containing devices also tend to be inefficient as a result of short minority carrier lifetimes caused by traps related to oxygen incorporation, especially for devices with high Al content.

LEDs emitting in the green range are desirable for use both as inherently green light sources and as component elements in white light or other mixed color sources. There are two primary ways of producing high intensity white-light with LEDs. The first method is to use a phosphor material to convert monochromatic light from a typically blue or UV LED to broad-spectrum white light, in much the same way a fluorescent light bulb works. This is known as the phosphor conversion (PC) approach. The primary technological challenge presented by a phosphor conversion device is to improve the Color Rendering Index (CRI) of the PC white light output while also maintaining high efficiency. The CRI problem inherent in PC devices may be circumvented altogether by using the second white light generation method, a Red-Green-Blue (RGB) color mixing approach. According to this method, individual LEDs that emit the three primary colors, red, green and blue, provide a mixed output of wavelengths perceived as white light. The color mixing method of white light generation is very flexible. In theory any color output can be produced using red, green and blue sources. The color mixing method is however limited by the challenge of obtaining an LED efficiently emitting in the green gap.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment, by way of non-limiting example, is a method of fabricating an LED or fabricating the active regions of an LED. The method includes growing, depositing or otherwise providing a bottom cladding layer of a selected semiconductor alloy with an adjusted bandgap. Bandgap adjustment may be provided by intentionally disordering the structure of the cladding layer. A first active layer may be grown above the bottom cladding layer wherein the first active layer is fabricated of the same semiconductor alloys the cladding layer, with however, a partially ordered structure. The first active layer will also be fabricated to include a selected n or p type doping. As used herein, the term "grown above" means that a layer is deposited, grown or otherwise formed upon a first layer. The term "above" does not refer to the relative location or position of layers when incorporated into a device.

The representative method further includes growing a second active layer above the first active layer where the second active layer is fabricated from the same semiconductor alloy. The second active layer will also be fabricated to have a partially ordered structure and an n or p type doping which is opposite the doping of the first active layer. The method further includes growing a top cladding layer above the second active layer. The top cladding layer is also fabricated from the selected semiconductor alloy with an intentionally disordered structure. Together, the first and second active layers will create a functional p-n junction. An undoped or lightly doped i layer or other functional or non-functional layers may be included within or around the structure fabricated by the above method as is necessary to create a functional device. As used herein, a lightly doped layer is defined as a semiconductor layer having sufficient doping to be conductive, but less doping than is typical in the layers forming a p-n junction.

An alternative non-limiting representative embodiment of a method may include growing top and bottom cladding layers from a different semiconductor alloy, provided that the band gap of the cladding layer alloys is greater than the band gap of the active layer alloys. In the foregoing embodiments, the cladding and active layers are fabricated to form a p+ p n n− junction. If the same semiconductor alloy is selected for each layer, the variations in bandgap necessary for efficient device operation will be imparted by intentionally causing the cladding layers to be more disordered than the active layers.

An alternative non-limiting representative embodiment includes a method of fabricating an LED where the active layer is an undoped or lightly doped i layer of semiconductor alloy with a partially ordered structure. In this embodiment, a bottom cladding layer of a selected semiconductor alloy having a disordered structure and a selected n or p type doping may first be grown upon a substrate, or upon the top layer of a compositionally step graded layer. The undoped or lightly doped active layer may be grown upon the bottom cladding layer. A top cladding layer may be grown upon the undoped or lightly doped active layer, where the top cladding layer has a disordered structure and an n or p type doping that is opposite the doping of the first cladding layer. In this embodiment, the cladding and active layers are fabricated to form a p-i-n junction. If the same semiconductor alloy is selected for each layer, the variations in bandgap necessary for efficient device operation will be imparted by intentionally causing the cladding layers to be more disordered than the active i layer.

The various representative methods may further include providing a GaAs or Ge substrate. The cladding and active layers could be grown upon the substrate, or multiple compositionally step graded layers may be grown above the substrate to bridge any lattice mismatch with the substrate. In these embodiments, the bottom cladding layer may be grown upon the final step graded layer.

The methods disclosed herein may be implemented with any semiconductor alloy. One semiconductor alloy which is particularly useful for the fabrication of an LED is $Ga_xIn_{1-x}P$.

Alternative representative embodiments may include but are not limited to an LED fabricated by any of the methods disclosed herein. Other embodiments may include but are not limited to multi-colored LED-based light emission devices having an active region fabrication according to any one of the methods disclosed herein.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

FIG. 4 is a schematic diagram of a representative LED fabricated by a disclosed method.

DESCRIPTION

Figure 1:
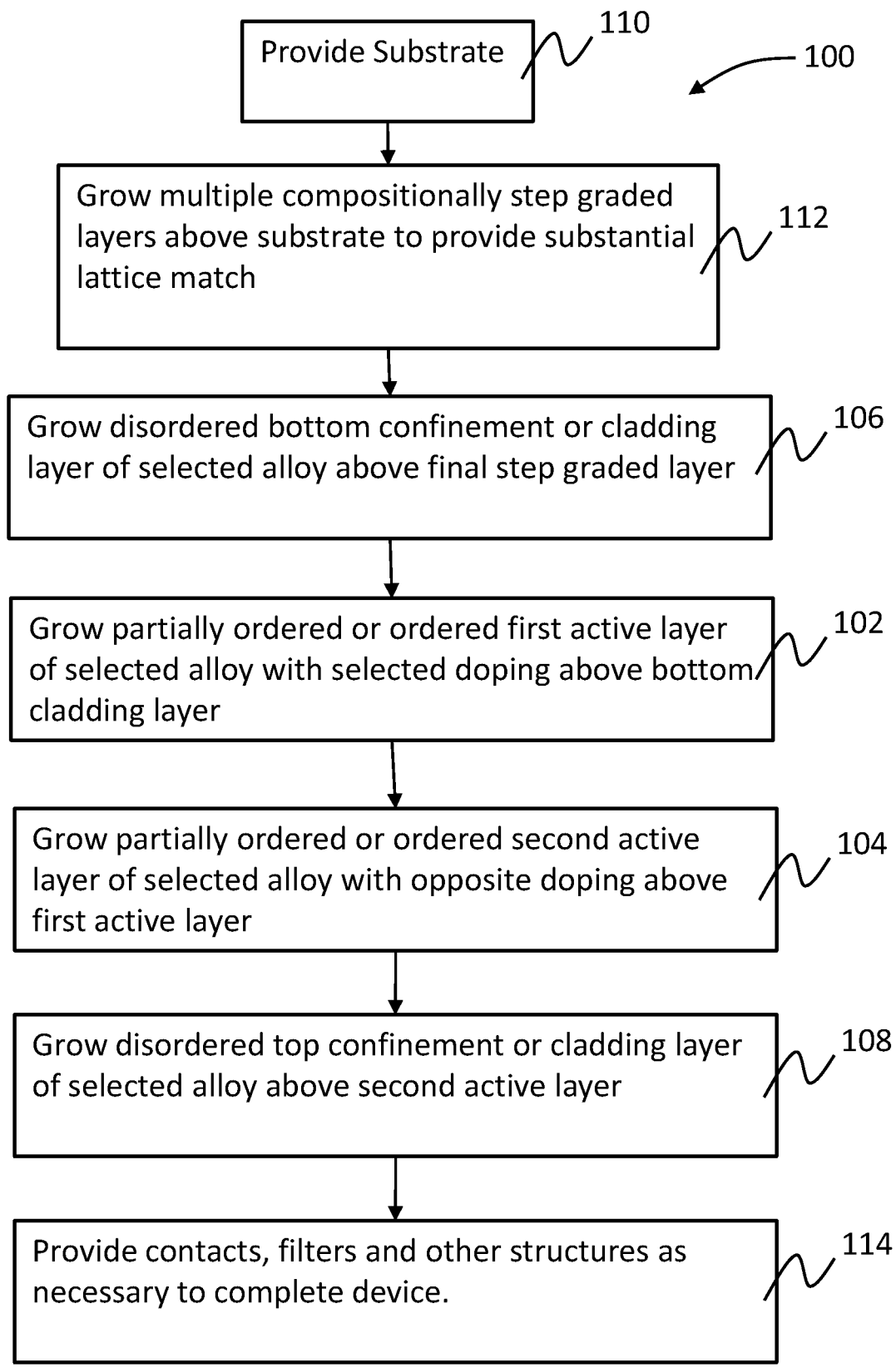
FIG. 1 is a flowchart describing a representative disclosed method.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise.

A material may be described herein as being "single crystal." Single crystal very specifically means an ingot, wafer or epilayer that is truly a single crystal, with no grain boundaries. "Crystalline" is a more general term for a substantially crystalline material which can have grain boundaries. Crystalline shall be understood to mean substantially crystalline, and having sufficiently well developed crystal structure that one skilled in the art would refer to the material as being crystalline. The terms single crystal and crystalline do not mean absolutely defect free. Both types of materials will have defects and or dislocations.

Certain abbreviations may be made herein with respect to the description of semiconductors and semiconductor alloys. These abbreviations shall not be construed as limiting the scope of the disclosure or claims. For example, the form "InGaAlN" is a common abbreviation to improve readability in technical manuscripts. Abbreviated forms such as "InGaAlN" are defined as equivalent to an expanded form, for example; "$In_xGa_yAl_{1-x-y}N$".

As used herein, "epitaxy," "epitaxial" and "epitaxially" are generally defined as relating to the process where one crystalline substance is grown or deposited on another crystalline substance in an ordered, partially ordered or disordered manner. Depending upon the structure of the material grown and the substrate, an epitaxial process may feature more or less of a lattice match between a layer and the growth substrate. As used herein in relation to epitaxial processes, "grown" and "grow" are synonymous with "deposited" and "deposit." As used herein, the term "on" or the phrases "grown on" or "deposited on" when used to describe the order of the layers of a complex semiconductor device, or the process of fabricating a complex semiconductor device, shall include layers grown adjacent to each other or layers grown in relation to each other, but with intervening layers. In addition, the word "above" when used to describe the relationship of one layer to another shall be defined to include layers subsequently applied or grown on initial layers, whether or not the subsequent layers are positioned above or below the first layers in use.

Heteroepitaxy is a kind of epitaxy performed with materials that are different from each other. The methods disclosed herein may involve heteroepitaxy or homoepitaxy. Various techniques are known for causing epitaxial growth, including but not limited to vapor-phase epitaxy (VPE), liquid phase epitaxy (LPE), molecular beam epitaxy (MBE), metal organic chemical vapor deposition (MOCVD) and others. The methods disclosed herein are not limited to any particular epitaxy method.

The method and device embodiments disclosed herein include methods of fabricating all of, or the active portions of, an LED or similar device. The disclosure also encompasses LED devices fabricated by the disclosed methods. The disclosed embodiments utilize the variations in the optical and electrical properties of a semiconductor alloy that may be achieved by intentionally controlling the relative ordered or disordered arrangement of the constituent atoms in a substantially crystalline semiconductor alloy lattice. A semiconductor alloy having at least two isovalent species may be described as relatively disordered because the isovalent constituent atomic species may occupy entirely or nearly random sites. An alloy may be described as relatively ordered if the isovalent species occupy highly ordered sites within the lattice. More particularly, a crystal structure with randomly placed isovalent atoms may be viewed as being disordered as there is no long range correlation between the positions of a particular isovalent species within the overall lattice. On the other hand, it is known that with respect to some semiconductor alloys, special three-dimensional ordered atomic arrangements can minimize total energy of the alloy while concomitantly adjusting the alloy bandgap.

The nature of an alloy lattice as ordered, partially ordered or disordered is of functional significance because the relative degree of ordering changes the electronic, vibrational, structural, mechanical and magnetic properties of the material. Thus, an ordered sample of a selected semiconductor alloy may have optical and electrical properties which are significantly different from a partially ordered or disordered sample of the alloy having identical atomic composition. Changes in material bandgap resulting from ordering or disordering are of relevance to the present disclosure. Control of ordering in high-Ga concentration GaInP alloys near the Γ-X crossover may allow maintenance of the direct bandgap nature of the alloys at higher bandgap levels, enabling the preparation of higher direct bandgap alloys for emitting within the green gap.

It is important to note that lattices and layers are described for convenience herein as "ordered", "partially ordered" and "disordered". It should not be inferred that this nomenclature requires the preservation or observation of distinct levels of ordering. Any semiconductor alloy that can exhibit long range kinetic ordering may exist in various levels of order ranging from relatively random or disordered to highly ordered, where each isovalent species substantially occupies a separate plane within the lattice structure. The alloy may have a degree of order anywhere along the range from highly ordered to totally random. As used herein, an ordered layer is defined as having more order than a partially ordered layer of the same alloy and a partially ordered layer is defined as having more order than a disordered layer of the same alloy. Thus the terms used to describe order are relative and describe the relative position of a semiconductor alloy upon an ordered to disordered continuum, rather than absolute levels of order.

The relative degree of ordering can be manipulated during the construction or reconstruction of a lattice, for example, during epitaxial deposition. The relative degree of ordering may be manipulated by methods including but not limited to controlling growth temperature, growth rate, V/III component ratio, Zn-doping, the presence of a surfactant and perhaps other growth factors.

One representative and non-limiting embodiment disclosed is a method of fabricating a LED or similar device. Alternatively, the methods may be used to fabricate the active regions of a LED or other device. As illustrated in FIG. 1, the representative method 100 includes the steps of growing at least first and second active layers from a selected semiconductor alloy (steps 102-104). The semiconductor alloy may be any ternary, quaternary or higher semiconductor alloy that is suitable for the desired device and which can be grown to have a relatively ordered or disordered lattice. One of the first and second active layers will be n-type doped and the other active layer will be p-type doped. Therefore, the first and second active layers will form a p-n junction. The junction may include any number of supplemental layers or structures as is necessary to provide the desired device performance. Both of the first and second active layers will have been prepared to have an ordered or partially disordered lattice. Any technique may be used during layer growth to provide the desired degree of order. For example, growth conditions including but not limited to growth temperature, growth rate, V/III component ratio, Zn-type doping concentration, the presence or absence of a surfactant and other methods may be used to control the relative level of order within the first and second active layer lattices.

Figure 2:
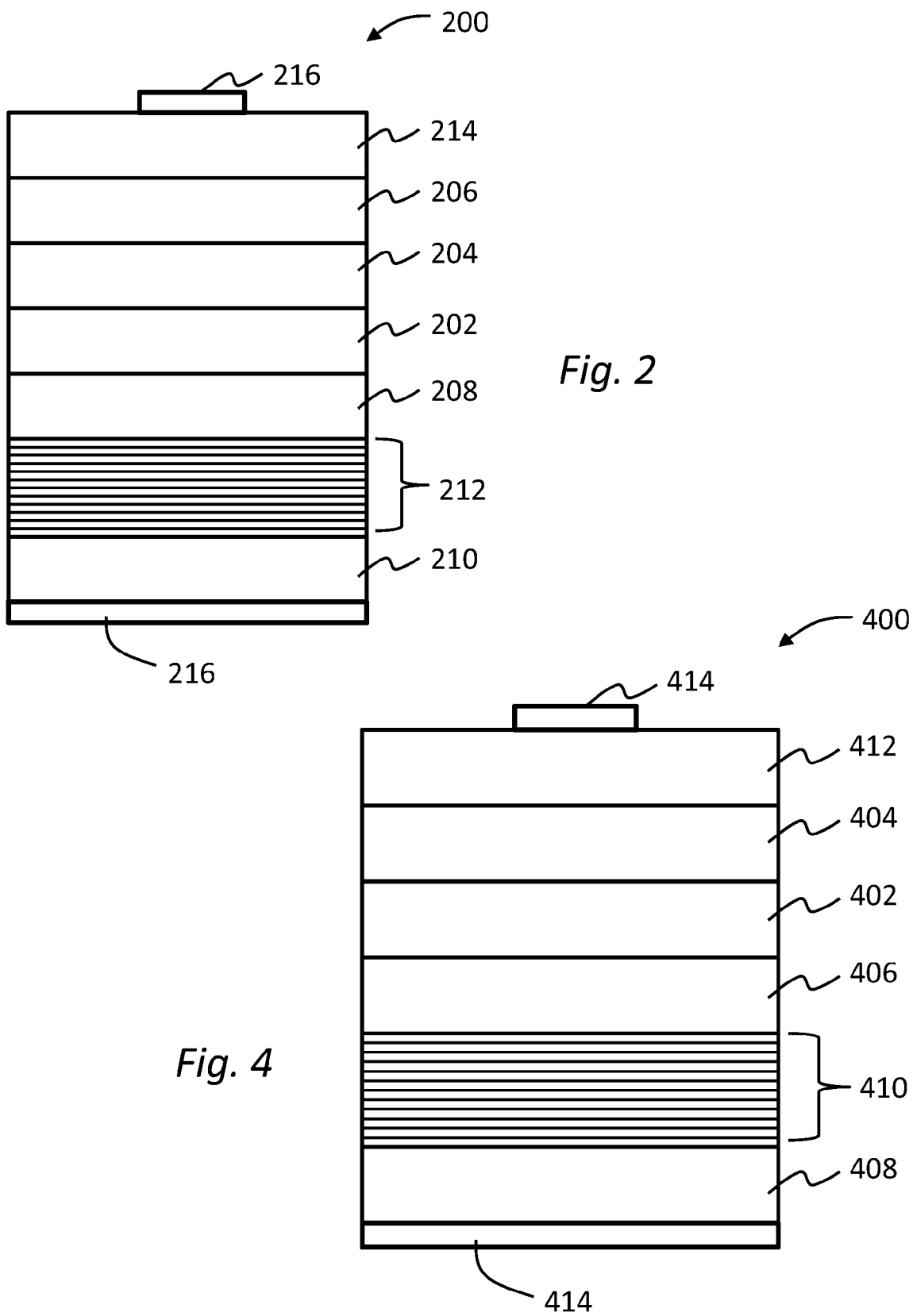
FIG. 2 is a schematic diagram of a representative LED fabricated by a disclosed method.

Another related embodiment is a device or portion of a device, for example a LED prepared according to method 100. A representative device is shown in FIG. 2. The device may be a LED 200 having first and second active layers 202 and 204 prepared as described above. The device may also include top and bottom cladding layers 206 and 208 respectively, the cladding layers being associated with the active layers 202, 204 (See steps 106-108, FIG. 1). The top and bottom cladding layers 206, 208 may be fabricated from the same semiconductor alloy selected for the active layers 202, 204. Alternatively, the cladding layer could be made of an inherently higher bandgap alloy such as $(Al_yGa_{1-y})_xIn_{1-y}P$. The top and bottom cladding layers 206, 208 may be doped as required for device functionality as described in detail below. The top and bottom cladding layers 206, 208 will however be prepared to have a relatively higher bandgap and could be made of a relatively highly disordered GaInP lattice or, for example, a $(Al_yGa_{1-y})_xIn_{1-x}P)$ alloy. Thus, the active layers and the cladding layers will have different optical and electronic properties, as described in detail with respect to specific examples below. Even though the top and bottom cladding layers 206, 208 and active layers 202, 204 have different properties, the cladding layers in certain embodiments may be fabricated from the same alloy as the active layers. Thus, the cladding and active layers may be epitaxially grown upon each other in a highly lattice matched fashion thereby enhancing material quality and stability.

Figure 3:
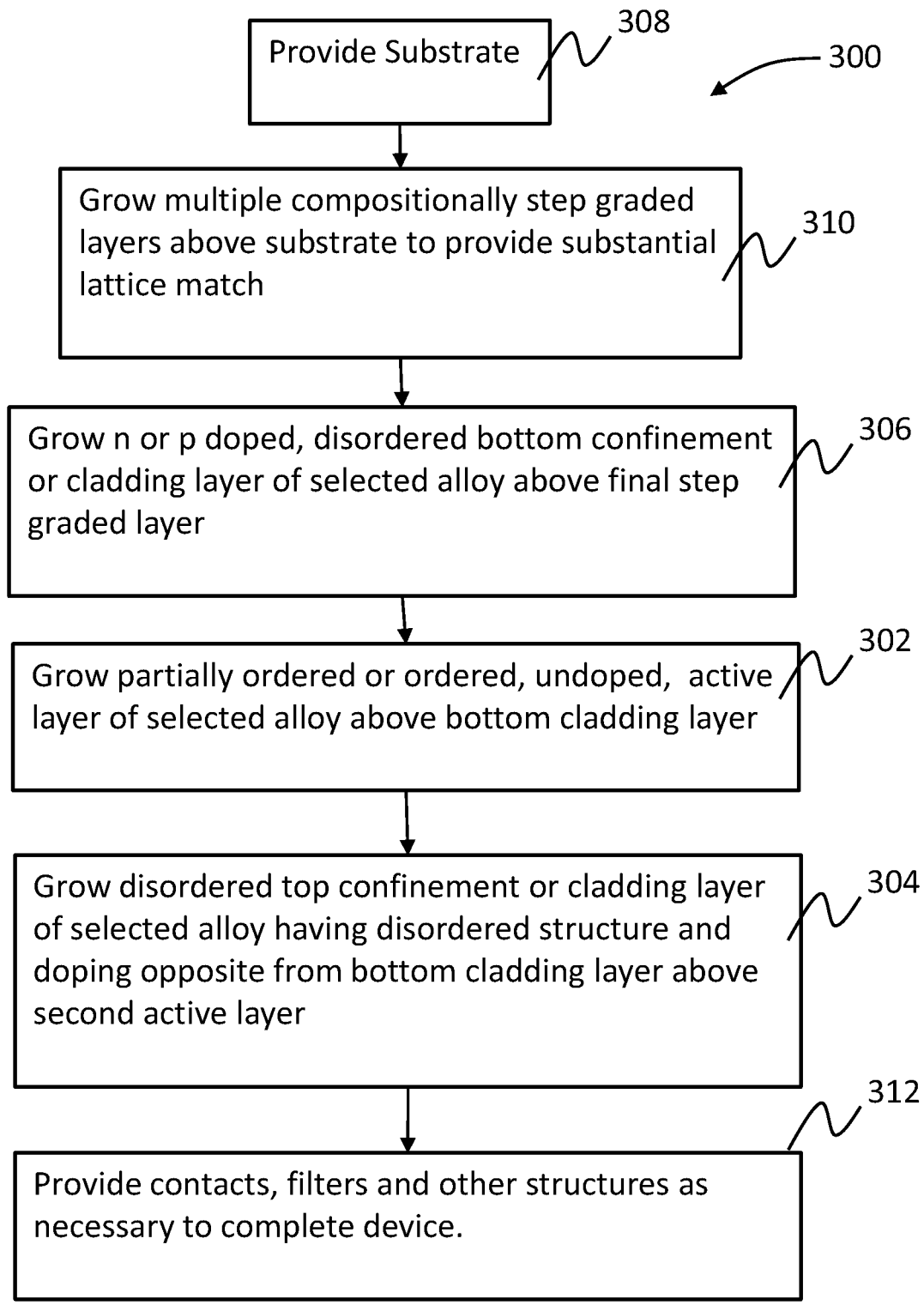
FIG. 3 is a flowchart describing a representative disclosed method.

Another representative embodiment is an alternative method of fabricating a LED or the active regions of a similar device. As illustrated in FIG. 3, the method 300 includes the steps of growing at least one active layer (i) from a selected semiconductor alloy (step 302). The semiconductor alloy may be any ternary, quaternary or higher semiconductor alloy that is suitable for the desired device and which can be grown to have a relatively ordered or disordered lattice. The active layer will be undoped or lightly doped. As defined herein, a lightly doped layer is sufficiently doped to impart conductivity, but not as heavily doped as is typical with the layers of a p-n junction. The active layer may have a level of order or disorder selected to provide a specific bandgap. Any technique may be used during layer growth to provide the desired degree of order. For example, growth conditions including but not limited to growth temperature, growth rate, V/III component ratio, Zn-doping, the presence or absence of a surfactant and other methods may be used to control the relative level of order within the active layer lattice.

A device or portion of a device prepared according to the method 300 is another representative embodiment disclosed herein. A representative device is shown in FIG. 4. The device may be a LED 400 having an undoped or lightly doped active layer 402 prepared as described above. The device may also include top and bottom cladding layers 404 and 406 respectively, the cladding layers being associated with the active layer 402 to form a p$^+$ i n$^-$ structure, (See steps 304-306, FIG. 3). The top and bottom cladding layers 404, 406 may be fabricated from the same semiconductor alloy selected for the active layer 402. Alternatively, the cladding layers could be made of an inherently higher bandgap alloy such as (Al$_y$Ga$_{1-y}$)$_x$In$_{1-x}$P)). One of the top and bottom cladding layers 404, 406 will be doped p and the other will be doped n, as required for device functionality.

In embodiments where the top and bottom cladding layers 404, 406 are of the same alloy as the active layer 402, these cladding layers will also be prepared to have a relatively higher band gap and could be made of a relatively highly disordered GaInP lattice. Alternatively, an inherently higher bandgap alloy, a (Al$_y$Ga$_{1-y}$)$_x$In$_{1-x}$P) alloy for example could be selected for the cladding layers. Thus, the active layers and the cladding layers will have different optical and electronic properties. Even though the top and bottom cladding layers 404, 406 and the active layer 402 have different properties, these layers in certain embodiments may be fabricated from the same alloy as the active layer. Thus, the cladding and active layer may be epitaxially grown upon each other in a highly lattice matched fashion thereby enhancing material quality and stability.

The semiconductor alloy selected for desired active and cladding layers may not be suitable for substantially lattice matched growth directly on a readily available substrate. Therefore, it may be necessary to provide a substrate 210, 408 and grow multiple step graded intermediate layers 212, 410 upon the substrate prior to the fabrication of the active and cladding layers (Steps 110 and 112, FIG. 1; Steps 308 and 310, FIG. 3). The use of compositionally step graded intermediate layers 212, 310 allows small and controlled lattice mismatch between layers to be gradually adjusted to the point where the active and cladding layers may be grown with minimal lattice mismatch induced strain and corresponding strain induced defects. The substrate 210, 408 may be any type of substrate that is suitable for the desired device and which may support the epitaxial growth of the selected active and cladding layers, with or without the use of intermediate compositionally step graded layers.

One or more of the above methods may be used for the construction of a LED emitting in the green gap by approaching the green gap not from the lower limit (530 nm) but from the upper limit (570 nm). Known green LEDs are typically fabricated from alloys of either GaInN or AlGaInP. With respect to GaInN, the material quality is generally poor because of high defect density, and therefore the LED efficiency is low. With respect to AlGaInP, the material quality suffers from short minority carrier lifetimes. Selected embodiments disclosed herein describe a substantially aluminum-free active layer design for a LED emitting in the green gap. In other embodiments, the active layer could have a small fraction of aluminum incorporated, to adjust a desired bandgap.

In particular, one embodiment features the fabrication of an LED using a GaInP alloy grown on conventional GaAs substrate. Ga$_{0.51}$In$_{0.49}$P alloy is well known to be lattice matched to a GaAs substrate. Disordered Ga$_{0.51}$In$_{0.49}$P has a bandgap of greater than 1.9 eV and can be used to fabricate two and three junction tandem solar cells. Ga$_{0.51}$In$_{0.49}$P is also an important alloy used for the fabrication of LEDs emitting in the red portion of the spectrum. Although a GaInP device emitting in the green gap is described in detail below, it is important to note that the disclosed methods are generally applicable to other alloy types or compositions, other wavelength ranges and other types of devices.

The green emitting GaInP LED embodiment relies upon material bandgaps achieved by intentional kinetic ordering or disordering of the various layers of GaInP during metalorganic vapor phase epitaxial (OMVPE) growth. Under certain conditions of growth, the group-III sublattice has a tendency to order and the energy bandgap in the resultant crystal is found to be lowered. This phenomenon has been well-studied in the Ga$_{0.52}$In$_{0.49}$P alloy that is lattice-matched to GaAs. The degree of ordering has been determined to depend upon factors such as growth temperature, growth rate, V/III ratio, Zn-doping, the presence or absence of a surfactant, and perhaps other factors. In addition, a tendency for ordering/disordering is also prevalent in alloy samples prepared to have an inherently higher bandgap.

As described below, GaInP samples have been synthesized with compositions having Ga levels as high as Ga$_{0.76}$In$_{0.24}$P. In addition, GaInP alloys are expected to exhibit ordering at even higher bandgap compositions.

Higher bandgap GaInP alloys may be grown on GaAs substrates by first growing a relatively thick step-graded layer of GaAs$_{1-y}$P$_y$ to reduce the in-plane lattice constant. The GaInP, AlGaInP or other epilayers may then be deposited nearly strain-free. A selected flux of antimony may used as a surfactant to disorder the crystal during growth.

Experimentation has shown that for Ga$_{0.76}$In$_{0.24}$P, the bandgap with no antimony surfactant used during deposition was 2.166 eV while the bandgap with 50 ppm antimony ([Sb]/[V], where [V] refers to the total group V pressure in the gas phase) was 2.209 eV. Furthermore, the bandgap observed after deposition with 100 ppm antimony surfactant was 2.246 eV. Thus, a variation in the bandgap range of about 80 meV has been achieved by manipulating the ordering of this alloy with a surfactant during deposition. It is believed that a wider range of bandgap manipulation, for example within the range of 2.0 eV to 2.25 eV may be achieved by further manipulating material ordering or disordering by adjusting surfactant flow rate or another growth parameter.

This bandgap adjustment may be employed advantageously in the active region of a device by using higher bandgap disordered alloys as confinement or cladding layers in a double heterostructure. For example, as described in detail below, active layers may be formed from partially ordered Ga$_{0.76}$In$_{0.24}$P, with a bandgap of ~2.205 eV, while top and bottom confinement layers may be formed from disordered Ga$_{0.76}$In$_{0.24}$P with a bandgap of ~2.245 eV.

An n-p or p-n junction may be formed in the active layers using a suitable n-type dopant and a p-type dopant. A front contact layer of n-type GaAs may be deposited as the last layer in the structure and etched away after an electroplated contact is formed. A back contact can be formed on the bottom side of the substrate, assuming that the substrate and graded layers are all sufficiently p-doped. Alternatively, a back contact can be evaporated onto the top layer of the GaAsP step-graded buffer layer after the devices are isolated, with an external connection to both contacts made from the front side of the device. This latter method may help minimize any luminescence from the lower energy graded layers.

The various representative embodiments described in detail herein are not intended to be limiting. For example, a p$^+$ p n n$^-$ type structure is outlined above and shown in FIG. 2. The disclosed methods apply to all variants of LED design. For example the p-i-n structure of FIGS. 3 and 4. Additional supplemental structures and methods may be used to optimize light extraction, internal quantum efficiency, peak power, heat dissipation and other performance considerations of devices or active regions fabricated by the methods disclosed herein.

EXAMPLE

Using the methods described above, a $p^+$ p n $n^-$ diode structure, substantially as shown in FIG. 2, has been synthesized using relatively strain-free $Ga_xIn_{1-x}P$ at a composition just below critical point $x_c$ to prevent excessive losses due to Γ-X electron transfer. The LED samples prepared for this example were grown using atmospheric pressure organometallic vapour phase epitaxy (OMVPE) on 6° B miscut GaAs substrates. The $Ga_xIn_{1-x}P$ epilayers of the target alloy compositions are significantly lattice-mismatched with the GaAs substrate, and poor material quality with a high defect density would result if the misfit were not adequately bridged. To bridge the lattice mismatch, a relatively thick compositionally step-graded layer 212 of $GaAs_{1-y}P_y$ was grown on the substrate at 750° C. The phosphorus fraction of the step graded layer 212 was incrementally increased so that the mismatch per step was less than 0.2%. For LED structures with 76% gallium, a grade of ten steps, each 1 µm thick, adequately bridges the total misfit; the final layer in the grade was grown 2 µm thick to maximize relaxation before growth of the active and cladding layers. The $Ga_{0.76}In_{0.24}P$ layers may then be deposited nearly strain-free. Similar LEDs with a gallium fraction ranging from about 51% to 80%, including the sub range of 65% (0.65) to 76% (0.75) are possible with appropriate adjustments in the design of the grade. Preliminary studies of similar structures indicate a defect density of about $10^7$ cm$^{-2}$.

The $Ga_xIn_{1-x}P$ epilayers were deposited at 700° C. and selectively disordered by the use of an antimony surfactant during growth. Antimony was flowed at a concentration ratio [Sb]/[V] of about 100 ppm, where [V] represents the total vapor concentration of the group V reactants. With no surfactant, the bandgap of partially ordered $Ga_{0.76}In_{0.24}P$ is 2.16 eV, rising to 2.246 eV as the material is more fully disordered.

In the direction of growth, the active layers of the LED include a cladding layer of disordered p-type $Ga_{0.76}In_{0.24}P$ 208, followed by a partially ordered p-type layer of $Ga_{0.76}In_{0.24}P$ 202 and a partially ordered n-type layer of $Ga_{0.76}In_{0.24}P$ 204. Layers 202 and 204 together form a p-n junction. The junction was followed by a disordered n-type passivating cladding layer 206, followed by an n-type GaAs contact layer 214 that was removed after electrical contacts 216 were electroplated. Similar structures 412 and 414 may be grown or deposited on a prospective p-i-n device as shown in FIG. 4. An undoped or lightly doped i-type layer (Not shown on FIG. 2, but similar to layer 402 of FIG. 4) could have been grown between the active layers 202 and 204 to broaden the depletion region. The structure of this example is therefore $p^+$ p n $n^-$, but n-i-p, and p-i-n structures are also possible using similar techniques as described above and shown in FIGS. 3 and 4. Zinc and selenium were selected as p-type and n-type dopants, respectively, though other dopants are also possible and may indeed be preferable. The graded layer 212 was doped so that the bottom contact could be electroplated to the back surface of the substrate. The thicknesses and carrier concentrations of the individual layers could be adjusted to optimize total performance. The structures described above can be processed into individual LEDs using photolithographic techniques and standard etchants.

The LED device fabricated in the Example thus includes a double heterostructure (DH) that clads and passivates the active region. The specific active region of the example LED includes in its entirety an n-doped, partially ordered $Ga_{0.76}In_{0.24}P$ alloy of thickness 0.2 µm 202 and a p-doped partially ordered $Ga_{0.76}In_{0.24}P$ alloy of thickness 1 µm 204 that form a p-n junction. The top cladding layer 206 is an n-doped disordered $Ga_{0.76}In_{0.24}P$ alloy of thickness 0.05 µm and the bottom cladding layer 208 is a p-doped disordered $Ga_{0.76}In_{0.24}P$ of thickness 0.2 µm. The thicknesses and doping concentrations of the device may be varied to provide for device optimization. An n-doped GaAs layer 214 was grown after the top cladding layer for the front contact grid. A similar layer 412 could be grown on a prospective p-i-n device as illustrated in FIG. 4. This grid design is best suited for solar cells. For LED devices a current spreading layer and a minimal area front contact metal are desired for better performance.

Figure 5:
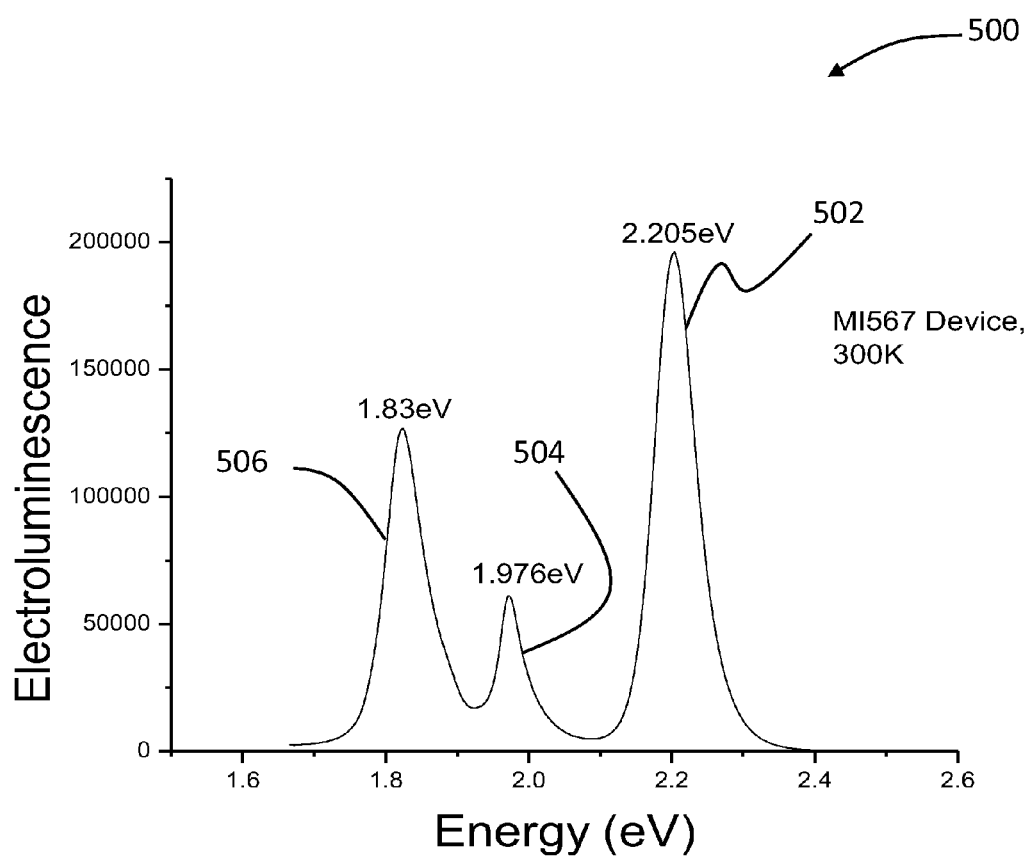
FIG. 5 is a graphic representation of the output of an LED fabricated according to a disclosed method.

The device of the Example, when forward biased, functions as an LED that emits green light as shown in the spectral response curve 500 of FIG. 5 with a dominant emission wavelength situated in the green gap. As illustrated on FIG. 5, the emission 502 at 2.205 eV (562.3 nm) is within the green gap and emanates from the active region of the p-n junction. Emission of wavelengths between 550 nm and 590 nm would be expected by adjusting the relevant bandgaps using ordering or by selecting different alloys for device construction. The two other emission peaks at 627 nm (element 504) and 677 nm (element 506) originate from optical pumping of the buffer step-graded layers by the emission of 2.205 eV electroluminescence. The mixing of this light with the 562 nm emission creates a yellowish green combined output. The secondary light emission originating from optical pumping of the buffer step-graded layers by the light emitted at 2.205 eV could be prevented by use of a Bragg reflector grown just below the bottom cladding layer 208. A $GaAs_{1-y}P_y/Ga_xIn_{1-x}P$ superlattice structure grown lattice matched to the corresponding $Ga_xIn_{1-x}P$ active layer 204 could be designed for this purpose.

In addition to the green gap described above, there also exists a red gap at about 615 to 625 nm. A red LED operating inside this gap can be designed using the processes outlined above for a green LED. In particular, the alloy used for the active and cladding layers and the relative degree of ordering may be selected and manipulated to create a red LEDs emitting within the wavelength range of 600 nm to 650 nm. Furthermore, red and green emission could be obtained in tandem from a single three or four terminal device, for example by optimizing the active structure such that the 627 nm and 677 nm peaks of FIG. 5 are replaced by a single peak located within the red gap.

The methods disclosed herein may thus be used to fabricate LEDs which will provide the wavelength components needed to realize a combination of two (bi-), three (tri-) or four (quad-) color approaches for producing white light with high CRI numbers. For example, the device of example 1 emitting in the yellow-green (570-580 nm) and red (610-620 nm) regions can provide two of the components required for the quad-color generation of white light. In particular, the red and yellow-green emission provided by the LED of example 1 could be combined with deep green and blue emissions which may also be obtained using GaN based LEDs for the quad-color production of white light. Such a multi-colored device may be optimized by utilizing a two-dimensional tiling of four LED colors, or a combination of four LEDs in tandem. In the case of the 2-dimensional tiling, each color LED could be designed to be of a different size to compensate for unequal efficiencies of the various color components or could be current-driven independently.

The above Example is provided for illustrative purposes only and is not intended to limit the scope of the disclosed embodiments. Various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

It should be understood by those skilled in the art that changes in the form and details may be made to the various embodiments disclosed herein without departing from the spirit and scope of the disclosure and that the various embodiments disclosed herein are not intended to act as limitations on the scope of the claims. All references cited herein are incorporated in their entirety by reference.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method of fabricating a LED comprising:
   growing a bottom cladding layer of a selected crystalline semiconductor alloy, wherein the alloy is $Ga_xIn_{1-x}P$ and includes a lattice having a disordered arrangement of isovalent alloy atoms occupying random sites within the crystalline lattice;
   growing a first active layer above the bottom cladding layer wherein the first active layer comprises the crystalline semiconductor alloy wherein the alloy includes a lattice having a partially ordered arrangement of isovalent alloy atoms occupying nearly random sites within the crystalline lattice having a selected n or p type dopant;
   growing a second active layer above the first active layer wherein the second active layer comprises the crystalline semiconductor alloy, wherein the alloy includes a lattice having a partially ordered arrangement of isovalent alloy atoms occupying nearly random sites within the crystalline lattice having an n or p type dopant opposite the dopant of the first active layer; and
   growing a top cladding layer above the second active layer wherein the top cladding layer comprises the crystalline semiconductor alloy, wherein the alloy includes a lattice having a disordered arrangement of isovalent alloy atoms occupying random sites within the crystalline lattice.

2. The method of fabricating a LED of claim 1 further comprising:
   providing at least one of a GaAs or Ge substrate;
   growing multiple compositionally step graded layers above the substrate; and
      growing the bottom cladding layer above a final step graded layer.

3. The method of fabricating a LED of claim 1 further comprising growing $Ga_xIn_{1-x}P$ semiconductor alloy layers having x greater than 0.51.

4. The method of fabricating a LED of claim 3 further comprising growing $Ga_xIn_{1-x}P$ semiconductor alloy layers having x within the range of 0.65 to 0.76.

5. The method of fabricating a LED of claim 4 further comprising:
   growing first and second active layers comprising partially ordered $Ga_{0.76}In_{0.24}P$; and
   growing top and bottom cladding layers comprising disordered $Ga_{0.76}In_{0.24}P$.

6. The method of fabricating a LED of claim 1 further comprising growing $Ga_xIn_{1-x}P$ semiconductor alloy layers having a bandgap of greater than 1.9 eV.

7. The method of fabricating a LED of claim 1 further comprising growing $Ga_xIn_{1-x}P$ semiconductor alloy layers having a bandgap of between 2.0 eV and 2.25 eV.

8. The method of fabricating a LED of claim 2 wherein the compositionally step graded layers comprise $GaAs_{1-y}P_y$.

9. The method of fabricating a LED of claim 8 further comprising incrementally increasing the phosphorus fraction of the compositionally step graded layers so that the lattice mismatch between adjacent layers is no more than 0.2%.

10. A method of fabricating a LED comprising:
    growing a bottom cladding layer of a selected crystalline semiconductor alloy wherein the alloy is $Ga_xIn_{1-x}P$ and includes a lattice having a disordered arrangement of isovalent alloy atoms occupying random sites within the crystalline lattice and having a selected n or p type dopant;
    growing one of an undoped or a lightly doped active layer above the bottom cladding layer wherein the active layer comprises the crystalline semiconductor alloy wherein the alloy includes a lattice having a partially ordered arrangement of isovalent alloy atoms occupying nearly random sites within the crystalline lattice; and
    growing a top cladding layer above the active layer wherein the top cladding layer comprises the crystalline semiconductor alloy, wherein the alloy includes a lattice having a disordered arrangement of isovalent alloy atoms occupying random sites within the crystalline lattice having an n or p type dopant opposite the dopant of the first active layer.

11. The method of fabricating a LED of claim 10 further comprising:
    providing at least one of a GaAs or Ge substrate;
    growing multiple compositionally step graded layers above the substrate; and
    growing the bottom cladding layer above a final step graded layer.

12. The method of fabricating a LED of claim 10 further comprising growing $Ga_xIn_{1-x}P$ semiconductor alloy layers having x greater than 0.51.

13. The method of fabricating a LED of claim 12 further comprising growing $Ga_xIn_{1-x}P$ semiconductor alloy layers having x within the range of 0.65 to 0.76.

14. The method of fabricating a LED of claim 13 further comprising:
    growing an active layer comprising partially ordered $Ga_{0.76}In_{0.24}P$; and
    growing top and bottom cladding layers comprising disordered $Ga_{0.76}In_{0.24}P$.

15. The method of fabricating a LED of claim 10 further comprising growing $Ga_xIn_{1-x}P$ semiconductor alloy layers having a bandgap of greater than 1.9 eV.

16. The method of fabricating a LED of claim 10 further comprising growing $Ga_xIn_{1-x}P$ semiconductor alloy layers having a bandgap of between 2.0 eV and 2.25 eV.

17. The method of fabricating a LED of claim 11 wherein the compositionally step graded layers comprise $GaAs_{1-y}P_y$.

18. The method of fabricating a LED of claim 17 further comprising incrementally increasing the phosphorus fraction of the compositionally step graded layers so that the lattice mismatch between adjacent layers is no more than 0.2%.

19. A LED comprising:
an active region comprising at least one n-doped layer of a selected crystalline semiconductor alloy wherein the alloy is $Ga_xIn_{1-x}P$ and includes a lattice having a partially ordered arrangement of isovalent alloy atoms occupying nearly random sites within the crystalline lattice and at least one p-doped layer of the crystalline semiconductor alloy wherein the alloy includes a lattice having a partially ordered arrangement of isovalent alloy atoms occupying nearly random sites within the crystalline lattice forming a junction with the n-doped layer;
at least one top cladding layer associated with the active region, the top cladding layer comprising layer of the crystalline semiconductor alloy arrangement of the alloy atoms wherein the alloy includes a lattice having a disordered arrangement of isovalent alloy atoms occupying random sites within the crystalline lattice; and
at least one bottom cladding layer associated with the active region, the bottom cladding layer comprising layer of the crystalline semiconductor alloy arrangement of the alloy atoms wherein the alloy includes a lattice having a disordered arrangement of isovalent alloy atoms occupying random sites within the crystalline lattice.

20. The LED of claim 19 further comprising:
a substrate comprising at least one of GaAs or Ge; and
multiple compositionally step graded layers above the substrate.

21. The LED of claim 19 wherein the selected semiconductor alloy comprises $Ga_xIn_{1-x}P$ having x greater than 0.52.

22. The LED of claim 21 wherein the selected semiconductor alloy comprises $Ga_xIn_{1-x}P$ having x within the range of 0.65 to 0.76.

23. The LED of claim 22 further comprising:
first and second active layers comprising partially ordered $Ga_{0.76}In_{0.24}P$; and
top and bottom cladding layers comprising disordered $Ga_{0.76}In_{0.24}P$.

24. The LED of claim 19 further comprising $Ga_xIn_{1-x}P$ having a bandgap of greater than 1.9 eV.

25. The LED of claim 19 further comprising $Ga_xIn_{1-x}P$ having a bandgap of between 2.0 eV and 2.25 eV.

26. The LED of claim 20 wherein the compositionally step graded layers comprise $GaAs_{1-y}P_y$.

27. The LED of claim 26 further comprising the compositionally step graded layers having a lattice mismatch between adjacent layers of no more than 0.2%.

28. The LED of claim 19 wherein the active layer provides for the emission of light having a wavelength of between 550 nm and 590 nm.

29. The LED of claim 19 wherein the active layer provides for the emission of light having a wavelength of between 600 nm and 650 nm.

30. The LED of claim 19 further comprising a bottom Bragg reflector grown just below the bottom cladding layer.

31. A LED comprising:
an active region comprising at least one of an undoped or lightly doped layer of a selected crystalline semiconductor alloy, wherein the alloy is $Ga_xIn_{1-x}P$ and includes a lattice having a partially ordered arrangement of isovalent alloy atoms occupying nearly random sites within the crystalline lattice;
at least one top cladding layer associated with the active region, the top cladding layer comprising a layer of the crystalline semiconductor alloy wherein the alloy includes a lattice having a disordered arrangement of isovalent alloy atoms occupying random sites within the crystalline lattice having p or n type doping; and
at least one bottom cladding layer associated with the active region, the bottom cladding layer comprising a layer of the crystalline semiconductor alloy wherein the alloy includes a lattice having a disordered arrangement of isovalent alloy atoms occupying random sites within the crystalline lattice having p or n type doping which is opposite the doping of the top cladding layer.

32. A multi-colored LED-based light emission device comprising:
an active region comprising at least one n-doped layer of a selected crystalline semiconductor alloy wherein the alloy is $Ga_xIn_{1-x}P$ and includes a lattice having a disordered arrangement of isovalent alloy atoms occupying random sites within the crystalline lattice and at least one p-doped layer of the crystalline semiconductor alloy wherein the alloy includes a lattice having a partially ordered arrangement of isovalent alloy atoms occupying nearly random sites within the crystalline lattice forming a junction with the n-doped layer;
at least one top cladding layer associated with the active region, the top cladding layer comprising a layer of the crystalline semiconductor alloy wherein the alloy includes a lattice having a disordered arrangement of isovalent alloy atoms occupying random sites within the crystalline lattice; and
at least one bottom cladding layer associated with the active region, the bottom cladding layer comprising a layer of the crystalline semiconductor alloy wherein the alloy includes a lattice having a disordered arrangement of isovalent alloy atoms occupying random sites within the crystalline lattice.

* * * * *